United States Patent
Hand et al.

(10) Patent No.: US 7,259,618 B2
(45) Date of Patent: Aug. 21, 2007

(54) SYSTEMS AND METHODS FOR LOAD DETECTION AND CORRECTION IN A DIGITAL AMPLIFIER

(75) Inventors: Larry E. Hand, Meridian, MS (US); Wilson E. Taylor, Austin, TX (US)

(73) Assignee: D2Audio Corporation, Austin, TX (US)

( * ) Notice: Subject to any disclaimer, the term of this patent is extended or adjusted under 35 U.S.C. 154(b) by 41 days.

(21) Appl. No.: 11/211,765

(22) Filed: Aug. 25, 2005

(65) Prior Publication Data

US 2007/0057720 A1 Mar. 15, 2007

(51) Int. Cl.
*H03F 3/38* (2006.01)
*H03F 1/52* (2006.01)
*G01R 19/00* (2006.01)

(52) U.S. Cl. .......................... 330/10; 330/2; 330/207 P
(58) Field of Classification Search ................. None
See application file for complete search history.

(56) References Cited

U.S. PATENT DOCUMENTS

| | | | |
|---|---|---|---|
| 4,554,512 A * | 11/1985 | Aiello | 330/10 |
| 5,652,542 A * | 7/1997 | Fink | 330/2 |
| 5,719,526 A * | 2/1998 | Fink | 330/2 |
| 6,229,389 B1 * | 5/2001 | Pullen et al. | 330/10 |
| 6,232,833 B1 * | 5/2001 | Pullen | 330/10 |
| 6,294,954 B1 * | 9/2001 | Melanson | 330/10 |
| 6,373,334 B1 * | 4/2002 | Melanson | 330/10 |
| 6,737,917 B2 * | 5/2004 | Ryoo et al. | 330/10 |
| 6,744,310 B2 * | 6/2004 | Honda | 330/2 |
| 7,078,964 B2 * | 7/2006 | Risbo et al. | 330/10 |

* cited by examiner

*Primary Examiner*—Robert Pascal
*Assistant Examiner*—Krista Flanagan
(74) *Attorney, Agent, or Firm*—Law Offices of Mark L. Berrier

(57) ABSTRACT

Systems and methods for detecting the impedance of an output load coupled to a digital amplifier and compensating for changes in the response of the amplifier. One embodiment of the invention is implemented in a Class D pulse width modulated (PWM) amplifier. In this embodiment, a digital PCM test signal is generated. This test signal is processed by the amplifier to produce a corresponding analog audio output signal that is used to drive a speaker. A sense resistor placed in series with the speaker is used to generate a test voltage that is compared to a reference voltage. When the test voltage reaches the reference voltage, the current through the sense resistor (hence the speaker) is at a known level, so the value of the digital test signal is noted. The impedance of the speaker is then determined from the test signal value and the speaker current.

20 Claims, 6 Drawing Sheets

SYSTEMS AND METHODS FOR LOAD DETECTION AND CORRECTION IN A DIGITAL AMPLIFIER

RELATED APPLICATIONS

This application claims priority to U.S. Patent application Ser. No. 10/805,741, entitled "Systems And Methods For Automatically Adjusting Channel Timing," by Taylor, et al., filed Mar. 22, 2004, which claims priority to: U.S. Provisional Patent Application No. 60/456,421, entitled "Output Device Switch Timing Correction," by Taylor, et al., filed Mar. 21, 2003; U.S. Provisional Patent Application No. 60/456,414, entitled "Adaptive Anti-Clipping Protection," by Taylor, et al., filed Mar. 21, 2003; U.S. Provisional Patent Application No. 60/456,430, entitled "Frequency Response Correction," by Taylor, et al., filed Mar. 21, 2003; U.S. Provisional Patent Application No. 60/456,429, entitled "High-Efficiency, High-Performance Sample Rate Converter," by Anderson, et al., filed Mar. 21, 2003; U.S. Provisional Patent Application No. 60/456,422, entitled "Output Filter, Phase/Timing Correction," by Taylor, et al., filed Mar. 21, 2003; U.S. Provisional Patent Application No. 60/456,428, entitled "Output Filter Speaker/Load Compensation," by Taylor, et al., filed Mar. 21, 2003; U.S. Provisional Patent Application No. 60/456,420, entitled "Output Stage Channel Timing Calibration," by Taylor, et al., filed Mar. 21, 2003; U.S. Provisional Patent Application No. 60/456,427, entitled "Intelligent Over-Current, Over-Load Protection," by Hand, et al., filed Mar. 21, 2003; each of which is fully incorporated by reference as if set forth herein in its entirety.

BACKGROUND

1. Field of the Invention

The invention relates generally to audio amplification systems, and more particularly to systems and methods for detecting the impedance of an output load coupled to a digital amplifier and compensating for changes in the frequency response of the amplifier.

2. Related Art

Pulse Width Modulation (POM) or Class D signal amplification technology has existed for a number of years. POM technology has become more popular with the proliferation of Switched Mode Power Supplies (SUMPS). Since this technology emerged, there has been an increased interest in applying POM techniques in signal amplification applications as a result of the significant efficiency improvement that can be realized through the use of Class D power output topology instead of the legacy (linear Class TAB) power output topology.

Early attempts to develop signal amplification applications utilized the same approach to amplification that was being used in the early SUMPS. More particularly, these attempts utilized analog modulation schemes that resulted in low performance applications. These applications were complex and costly to implement. Consequently, these solutions were not widely accepted. Prior art analog implementations of Class D technology have therefore been unable to displace legacy Class TAB amplifiers in mainstream amplifier applications.

Recently, digital POM modulation schemes have surfaced. These schemes use Sigma-Delta modulation techniques to generate the POM signals used in the newer digital Class D implementations. These digital POM schemes, however, did little to offset the major barriers to integration of POM modulators into the total amplifier solution. Class D technology has therefore continued to be unable to displace legacy Class TAB amplifiers in mainstream applications.

One of the problems with prior art systems and methods is that the quality and performance of the discrete output power switches and their associated drivers is unknown and varies as the performance and demand of the application change.

Another problem with prior art systems and methods is that the performance and quality characteristics of the remainder of the signal processing system vary with the applications in which they are used. Because the exact implementation in each system and the end-user applications are not deterministic, each system requires a point solution. These point solutions are not flexible, scaleable or transportable across applications.

Yet another problem with prior art systems and methods is that their frequency responses vary with changes in the respective load impedances. In a conventional open loop system, an output reconstruction filter produces a low-pass filter response that is dependent upon the output load. As the load of a particular system is increased, the high frequency response of the system decreases in a predictable manner.

Because of these problems with the prior art, it would be desirable to provide systems and methods to detect changes in output loads and to compensate for these changes to maintain an optimal frequency response and optimal performance.

SUMMARY OF THE INVENTION

One or more of the problems outlined above may be solved by the various embodiments of the invention. Broadly speaking, the invention comprises systems and methods for detecting the impedance of an output load coupled to a digital amplifier and compensating for changes in the frequency response of the amplifier.

One embodiment of the invention is implemented in a Class D pulse width modulated (POM) amplifier. In this embodiment, a digital POM test signal is generated. This test signal is processed by the amplifier to produce a corresponding analog audio output signal that is used to drive a speaker. A sense resistor placed in series with the speaker is used to generate a test voltage that is compared to a reference voltage. When the test voltage reaches the reference voltage, the current through the sense resistor (hence the speaker) is at a known level, so the value of the digital test signal is noted. The impedance of the speaker is then determined from the test signal value and the speaker current.

After the speaker impedance has been determined, the signal processing that is performed by the amplifier can be automatically adjusted to optimize the processing for the computed speaker impedance. The amplifier can thereby compensate for increased high-frequency response that would otherwise occur with higher-impedance loads and decreased high-frequency response that would occur with lower-impedance loads. In one embodiment, the impedance of the speaker is determined using test signals having multiple, different frequencies. This results in an impedance profile for the speaker, which may be used as the basis for modifying the signal processing performed by the amplifier. In one embodiment, the impedance profile can be compared to a library of profiles corresponding to specific speakers. If the impedance profile matches one of the library profiles, the speaker can be identified, and the audio signal processing performed by the amplifier can be optimized according to known parameters that are associated with the identified speaker.

One alternative embodiment comprises a method implemented in a digital amplifier. The method includes generating a digital test signal, converting the digital test signal to an analog signal and driving a load with the analog signal. A threshold level of current through the load is detected and the value of the digital test signal that generated the threshold level of current through the load is identified. Based on this information, an impedance is calculated for the load at the frequency of the test signal. The method can be repeated for multiple test signal frequencies to create an impedance profile. The impedance information can be used to automatically adjust the frequency response and/or other operating parameters of the amplifier. In one embodiment, the calculated impedance profile is compared to a library of profiles for known speakers, and if it matches one of the profiles, operating parameters for the corresponding speaker are implemented.

Another alternative embodiment comprises a digital amplifier that includes a digital test signal generator, a digital engine configured to convert the test signal to an analog signal, and an output stage. The output stage is configured to receive the analog signal and to drive a load and a sense resistor that is in series with the load. A comparator receives the voltage across the sense and a reference voltage which is equal to the resistance of the sense resistor times a threshold level of current. The comparator generates a binary signal indicating whether the voltage across the sense resistor exceeds the reference voltage. This binary signal is provided to a processor that identifies the value of the digital test signal corresponding to transitions in the binary signal. The processor then calculates an impedance of the load based on the threshold level of current and the value of the digital test signal corresponding to the transition in the binary signal. The amplifier may be configured to vary the frequency of the test signal and to determine the impedance of the load for various frequencies. Based on the impedance information, the processor automatically adjusts the processing input signals to optimize its performance for the detected load.

Numerous other embodiments are also possible.

The various embodiments of the present invention may provide a number of advantages over the prior art. For example, the embodiments of the present invention may be much less complex and easier to implement and maintain than in comparable prior art systems. Prior art systems that attempt to perform load detection typically measure output current and voltage with RMS-to-DC converters, then perform an A/D conversion on the full measured values, and then calculate the result of the voltage divided by the current. The present embodiments instead perform a simple comparison of analog values and produce a binary over-threshold signal. Another advantage that may be provided by embodiments of the invention is the automatic adjustment of the system processing in response to the detected load. Prior art systems typically require manual adjustment of operating parameters by a user. Present embodiments may adjust the frequency response of the amplifier in response to a one or more output load values, or may adjust other operating parameters that correspond to a particular speaker that is identified by comparing a calculated impedance profile to a library of profiles. Still other advantages may also be provided by the various embodiments of the invention.

BRIEF DESCRIPTION OF THE DRAWINGS

Other objects and advantages of the invention may become apparent upon reading the following detailed description and upon reference to the accompanying drawings.

Figure 1:
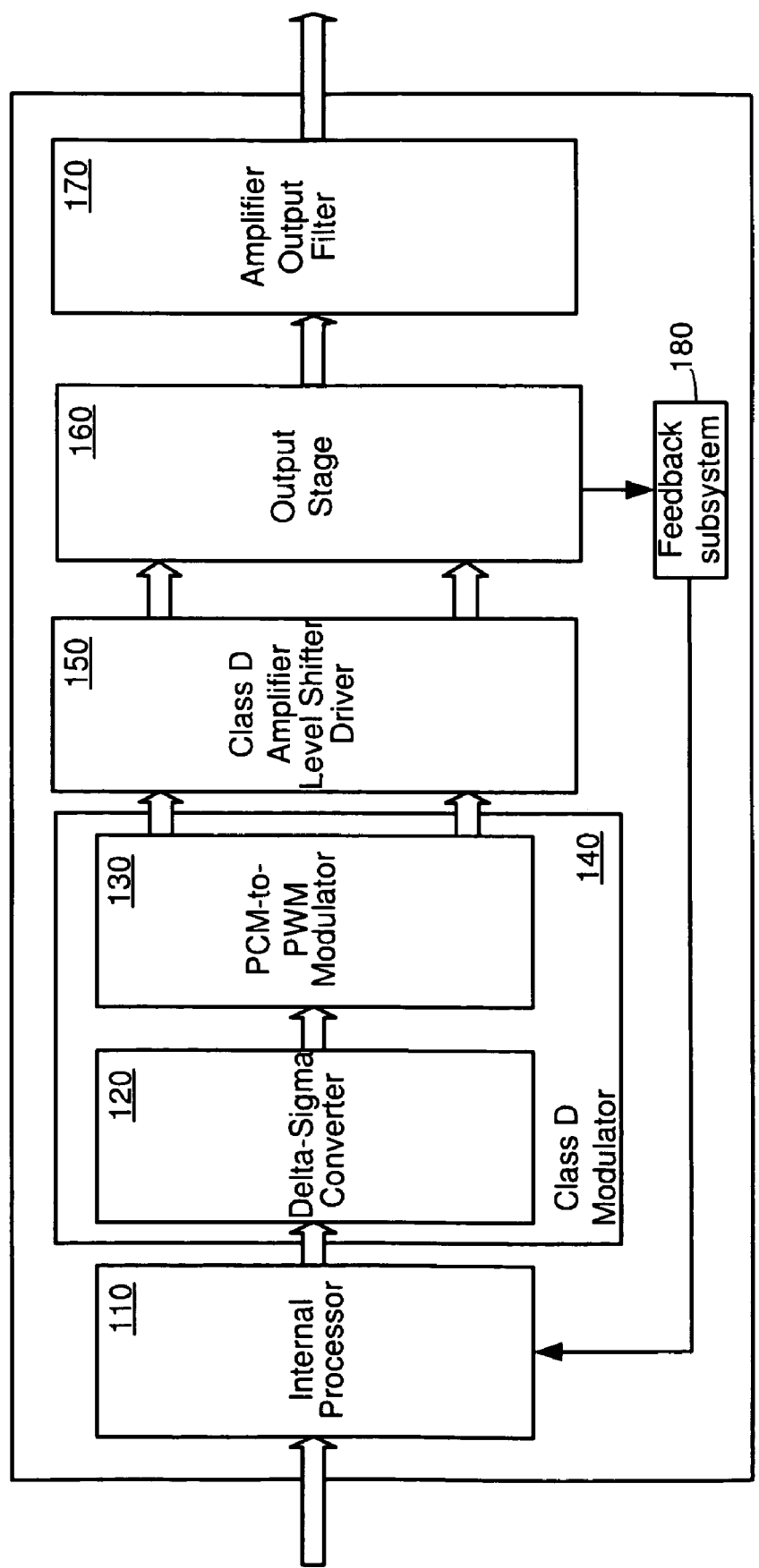
FIG. 1 is a functional block diagram illustrating a POM amplification system in accordance with one embodiment of the invention.

While the invention is subject to various modifications and alternative forms, specific embodiments thereof are shown by way of example in the drawings and the accompanying detailed description. It should be understood, however, that the drawings and detailed description are not intended to limit the invention to the particular embodiment which is described. This disclosure is instead intended to cover all modifications, equivalents and alternatives falling within the scope of the present invention as defined by the appended claims.

DETAILED DESCRIPTION OF PREFERRED EMBODIMENTS

One or more embodiments of the invention are described below. It should be noted that these and any other embodiments described below are exemplary and are intended to be illustrative of the invention rather than limiting.

As described herein, various embodiments of the invention comprise systems and methods for detecting the impedance of an output load coupled to a digital amplifier and compensating for changes in the frequency response of the amplifier. One embodiment is implemented in a Class D pulse width modulated (POM) amplifier. A mechanism is provided for determining the impedance of a speaker that is coupled to the output of the amplifier. The processing of the digital audio signal is then adjusted if necessary to optimize the frequency response of the amplifier for the specific impedance of the speaker.

In this embodiment, a digital test signal (e.g., a sine wave) is generated. This test signal is processed by the amplifier to produce a corresponding analog audio output signal that is used to drive the speaker. The current through the speaker is determined and used in conjunction with the test signal that produced the current to determine the impedance of the speaker. More specifically, the current through the speaker is used to generate a test voltage that is compared to a reference voltage. When the test voltage reaches the reference voltage, the value of the digital test signal is noted. The impedance of the speaker is then determined from this information.

After the impedance has been determined, the signal processing that is performed by the amplifier can be automatically adjusted to optimize the processing for the computed speaker impedance. The amplifier can thereby compensate for increased high-frequency response that would otherwise occur with higher-impedance loads and decreased high-frequency response that would occur with lower-impedance loads.

In one embodiment, the process of generating a test signal and determining the digital signal level at which the test voltage reaches the reference voltage is repeated for a variety of different test signals to produce an impedance profile for the speaker. This impedance profile may be used as the basis for modifying the signal processing performed by the amplifier. In one embodiment, the impedance profile can be compared to a library of profiles corresponding to specific speakers. If the impedance profile matches one of the library profiles, the speaker can be identified, and the audio signal processing performed by the amplifier can be optimized according to known parameters that are associated with the identified speaker.

Referring to FIG. 1, a functional block diagram illustrating a POM amplification system in accordance with one embodiment of the invention is shown. As depicted in the figure, POM amplification system 100 comprises an internal processor 110, a delta-sigma converter 120, a POM-to-POM modulator 130, a Driver 150, an output stage 160, a speaker 170 and a feedback subsystem 180. Delta-sigma converter 120 and POM-to-POM modulator 130 form a Class D modulator 140.

In normal operation, a digital audio signal is provided to processor 110 of the amplifier. Processor 110 performs audio processing on the received digital signal. Processor 110 may perform various types of processing on the signal, including pre-correction of the signal that will compensate for a non-optimal frequency response in the remainder of the amplifier. The processed digital audio signal is then converted to a 1-bit, pulse width modulated digital data stream by Class D modulator 140. This 1-bit data stream is characterized by two control signals that are output to driver 150, which then uses the signals to drive the upper and lower switches of output stage 160. The signal produced by output stage 160 can then be used to drive a speaker 170.

The structure of the amplifier in FIG. 1, with the exception of feedback subsystem 180, is very similar to a more conventional digital POM amplifier. As in conventional amplifiers, the processing of digital audio signals by the amplifier to produce analog output signals varies somewhat with frequency. Ideally, the frequency response of the amplifier would be flat across all audio frequencies. In practice, however, it may be difficult to achieve this ideal. Various types of processing (e.g., filtering) of the digital data are employed in an attempt to optimize (flatten) the frequency response of the amplifier. Typically, however, the processing performed by the amplifier is optimized for a point solution that incorporates a specific speaker impedance. If a speaker having a higher impedance is used, the frequency response tends to increase at higher frequencies. If a speaker having a lower impedance is used, the frequency response tends to droop at higher frequencies. The present embodiment therefore incorporates a mechanism to determine the impedance of the speaker and to adjust the frequency response if necessary to correspond to this impedance.

The Speaker impedance detection and compensation mechanism includes feedback subsystem 180. Feedback subsystem 180 is coupled to output stage 160 and is configured to detect a threshold level of current through speaker 170. When this threshold level of current is detected, a feedback signal that is provided to processor 110 is asserted. This feedback signal may also be referred to herein as an "over-threshold" signal, since the signal is asserted when the current through the speaker is over a threshold level. The assertion of the feedback signal is used by processor 110 to identify the value of a digital test signal that caused the speaker current to reach the threshold level. This value is then used by processor 110 to determine the impedance of speaker 170 at the frequency of the test signal.

It should be noted that the structure illustrated in FIG. 1 is merely exemplary. Other embodiments may incorporate more or fewer components, or may have alternative configurations.

Figure 2:
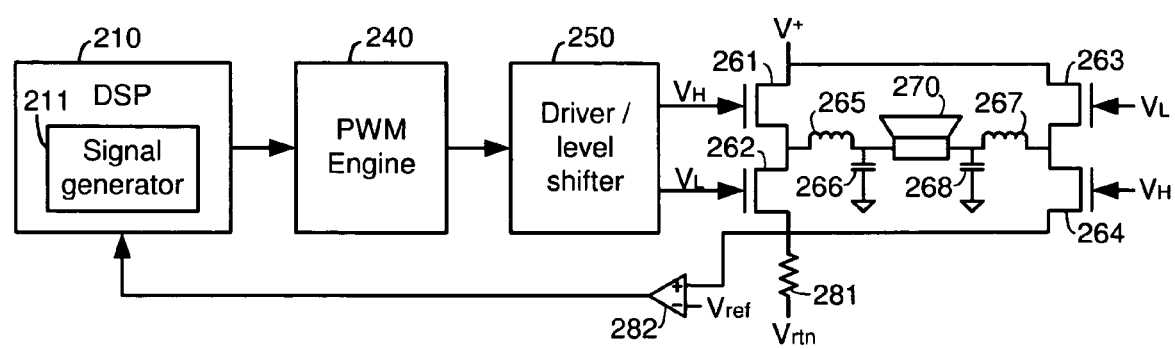
FIG. 2 is a more detailed diagram illustrating a digital POM amplifier in accordance with one embodiment.

Referring to FIG. 2, a more detailed diagram illustrating a digital POM amplifier in accordance with one embodiment is shown. As depicted in this figure, the processor of the amplifier is implemented using a digital signal processor (DIP) 210. DIP 210 includes a test signal generator 211. Test signal generator 211 is configured to generate pulse code modulated (POM) test signals that are provided to POM engine 240. POM engine 240 converts the stream of POM audio data that is received from DIP 210 into POM audio data. The POM data is provided to driver/level shifter 250, which produces a pair of signals to drive high-side and low-side switching transistors 261-264 in the output stage. Transistors 261-264 are switched on and off to allow current to flow through speaker 270, as well as through CL filters (consisting of inductors 265 and 267, and capacitors 266 and 268) on either side of the speaker. The feedback mechanism in this embodiment consists of a resistor 281 positioned in series with speaker 270, and a differential amplifier 282. Differential amplifier 282 receives the voltage across resistor 281 and a reference voltage as inputs, and provides an output signal indicating which of the voltages is higher to DIP 210.

The amplifier of FIG. 2 operates in essentially the following manner. Signal generator 211 generates a test signal that consists of a sine wave having a particular frequency and a particular amplitude. As noted above, the test signal consists of digital POM data. The POM test signal is converted by POM engine 240 into a POM signal, which is used by driver/level shifter 250 to generate high-side and low-side switching signals. These switching signals are essentially inverses of each other, aside from minor timing differences that need not be discussed here. When the high-side signal is asserted and the low-side signal is not, transistors 261 and 264 are switched on, and transistors 262 and 263 are switched off. Current therefore flows from the voltage source through transistor 261, inductor 265, speaker 270, inductor 267, transistor 264 and resistor 281. When the low-side signal is asserted and the high-side signal is not, transistors 262 and 263 are switched on, and transistors 261 and 264 are switched off. Current then flows from the voltage source through transistor 263, inductor 267, speaker 270, inductor 265, transistor 262 and resistor 281.

It is apparent that, whether the high-side or low-side signal is asserted (i.e., whether current is flowing in one direction or the other,) the current through speaker 270 also flows through resistor 281. The size of resistor 281 is chosen to be small (e.g., 50 mΩ) in order to minimize the effect of the resistor in the circuit. Since the voltage across resistor 281 is equal to the current through the resistor times the resistance of the resistor (i.e., V=AIR,) the voltage across the resistor is proportional to the current through the resistor (and through speaker 270.) Thus, when the voltage across resistor 281 reaches a threshold level, the current through the resistor and speaker 270 is at a corresponding threshold current level. The threshold voltage level across resistor 281 is determined by the reference voltage that is input to differential amplifier 282. When the voltage across resistor 281 is less than the reference voltage, the signal at the output of differential amplifier 282 is not asserted. When the voltage across resistor 281 is greater than the reference voltage, the signal at the output of differential amplifier 282 is asserted. Consequently, when the voltage across resistor 281 is equal to the reference voltage, the output signal of differential amplifier 282 transitions from low to high (if the voltage across resistor 281 is increasing) or from high to low (if the voltage across resistor 281 is decreasing.)

The output signal from differential amplifier 282 is provided to DIP 210. When the output signal of differential amplifier 282 transitions from low to high (or from high to low,) DIP 210 determines the value of the test signal produced by signal generator 211. The value of the test signal at the transition corresponds to the known speaker current, so it can be used to determine the impedance of the speaker. More specifically, the impedance of the speaker is calculated by multiplying a proportionality constant times the ratio of the POM test signal value and the voltage across resistor 281 (which is equal to the reference voltage.)

It should be noted that the impedance of the speaker is frequency-dependent. Consequently, the determination of the speaker impedance is performed with a test signal that has a constant frequency and a variable amplitude. It is preferred that the test signal be a sine wave having the selected frequency. The amplitude of the test signal is initially low and is increased until the voltage drop across resistor 281 matches the reference voltage, and the corresponding test signal value is determined. The POM test signal value is then used to determine the impedance of the speaker at the frequency of the test signal.

Figure 3:
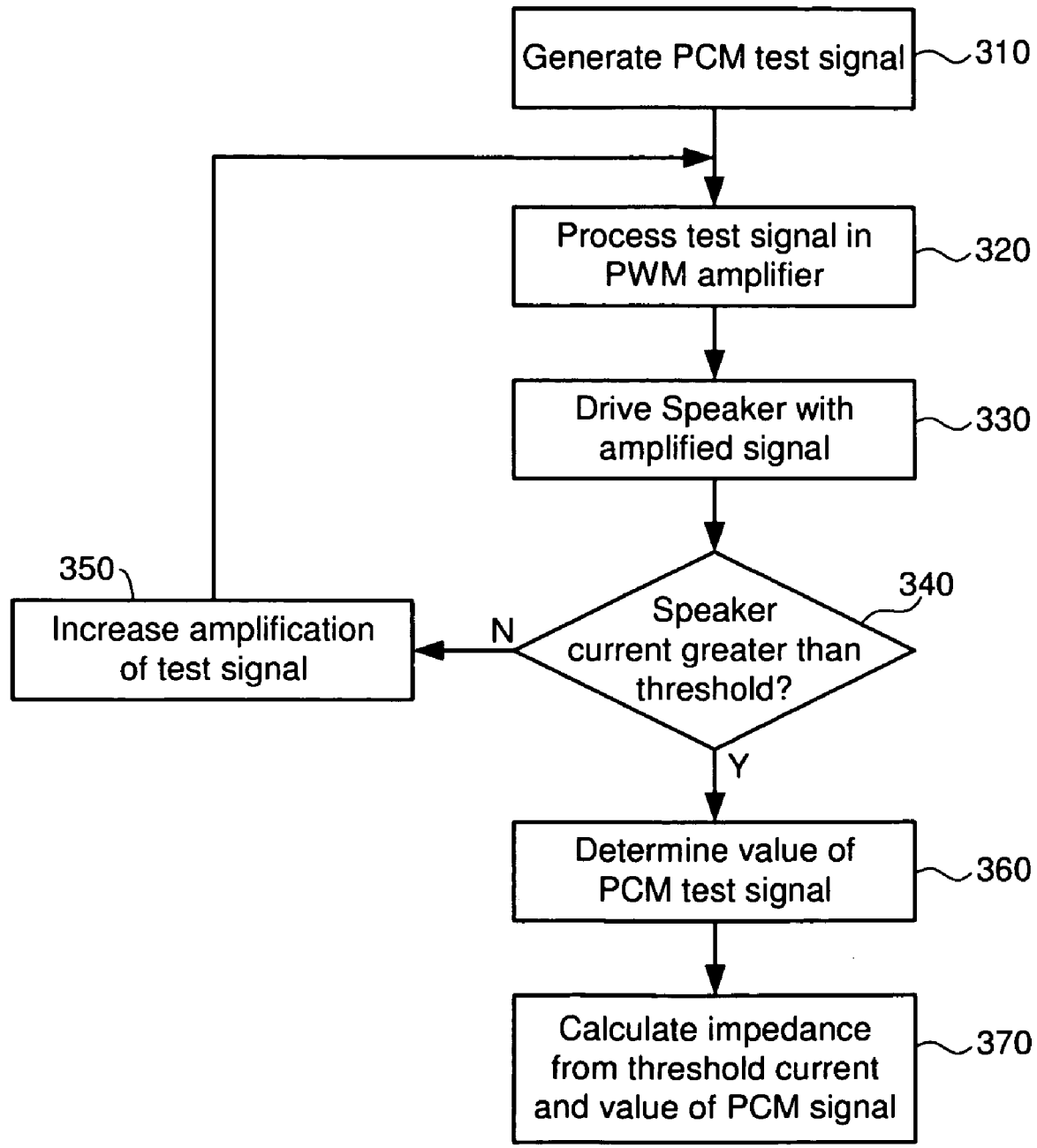
FIG. 3 is a flow diagram illustrating a method for determining the impedance of a load on the output of a digital amplifier in accordance with one embodiment.

The method implemented by the system of FIG. 2 is summarized in the flow diagram of FIG. 3. As shown in FIG. 3, a POM test signal is first generated (block 310.) As noted above, the test signal is preferably a sine wave having a fixed frequency. The test begins with the test signal at an initial amplitude, but the amplitude will be varied as described below. The digital POM test signal is processed by the POM amplifier (block 320) to generate an analog signal suitable for driving a speaker. This processing includes converting the POM signal to a POM signal and driving an output stage with the POM signal to produce the analog output signal. The POM amplifier may also be configured to filter the audio signal at various stages within the amplifier.

The analog output signal is then used to drive the speaker (block 330,) and the current through the speaker is monitored to determine whether the current has reached/exceeded a threshold level (block 340.) In the embodiment of FIG. 2, this is achieved by comparing the voltage across a sense resistor that is placed in series with the speaker to a reference voltage. The difference between the sense resistor voltage and the reference voltage is amplified to produce a binary signal that is low when the sense resistor voltage is less than the reference voltage and high when the sense resistor voltage is greater than the reference voltage. The transition of this binary signal from low to high indicates that the sense resistor voltage is equal to the reference voltage. If the binary signal is low, the amplitude of the test signal is increased slightly (block 350.) The increased-amplitude signal is processed by the POM amplifier (block 320) and used to drive the speaker (block 330.) This process continues until the sense resistor voltage is greater than the reference voltage.

When the sense resistor voltage is greater than the reference voltage, the speaker current is determined to be equal to (or just greater than) a threshold level (block 340.) This is indicated by the transition of the binary signal from low to high. The binary signal is provided to the DIP and, when the signal transitions from low to high, the DIP records the value of the POM signal at the test signal generator that caused the transition (block 360.) This may be accomplished, for example, by generating an interrupt when the transition is detected. The corresponding value of the POM signal corresponds to the known threshold current level through the speaker. The value of the POM signal and the threshold current level through the speaker are then used to calculate the impedance of the speaker (block 370.) Based upon the calculated impedance of the speaker, the response of the amplifier can be adjusted (e.g., to compensate for high-frequency peaking or drooping.)

Because the impedance of the speaker varies with frequency, it may be desirable to determine the impedance of the speaker at more than a single frequency. If so, then the same procedure described above can be repeated at one or more other frequencies. The resulting impedance values form an impedance profile (as a function of frequency) for the speaker. The impedance profile can be used as the basis for modifying the frequency response of the amplifier to optimize the performance of the amplifier for use with the speaker.

Figure 4:
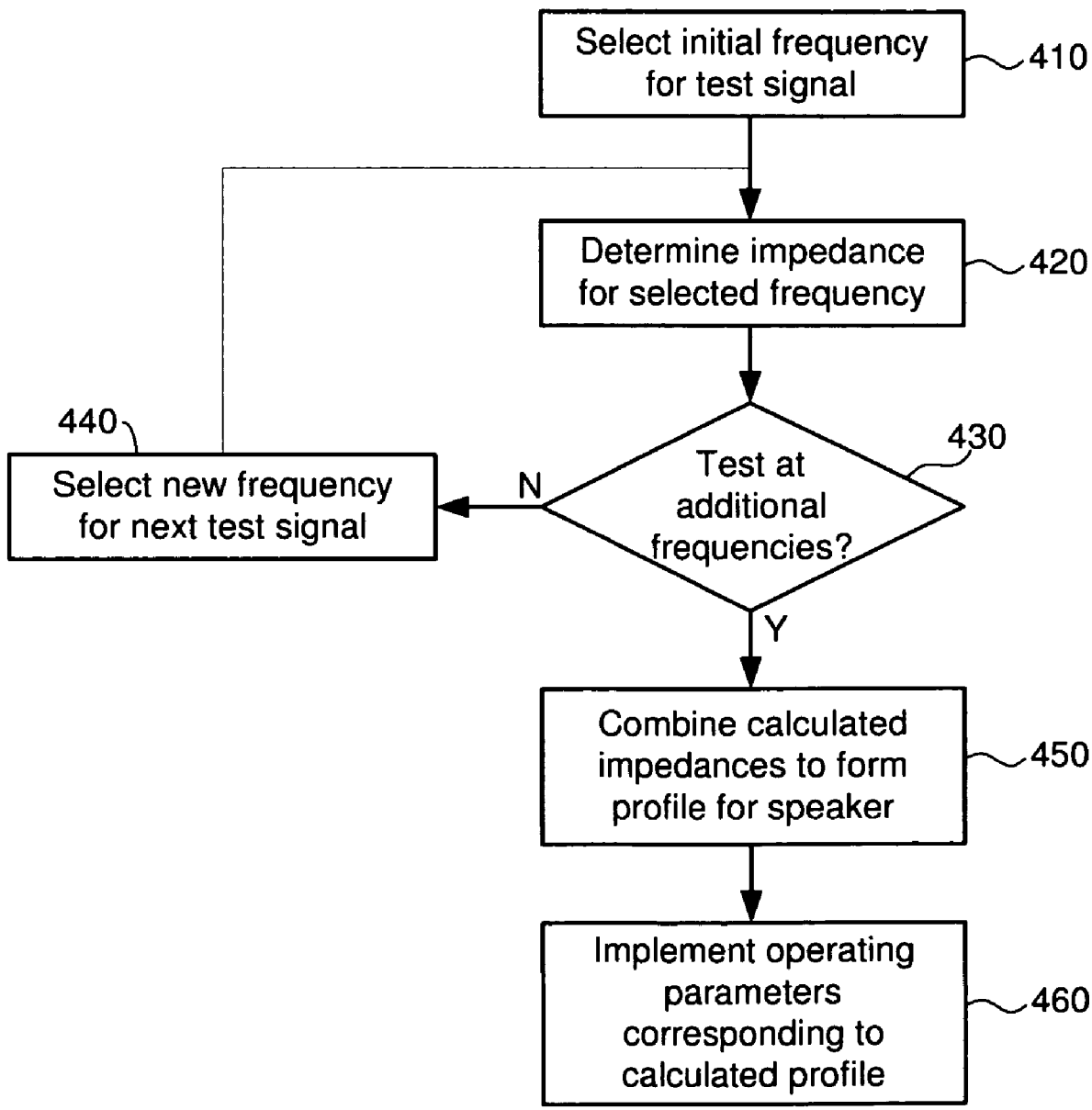
FIG. 4 is a flow diagram illustrating a method for generating an impedance profile for a load on the output of a digital amplifier in accordance with one embodiment.

Referring to FIG. 4, a flow diagram illustrating a method for generating an impedance profile for a speaker is shown. The method of FIG. 4 begins with the selection of a frequency at which an initial test will be performed (block 410.) The impedance at this initial frequency is then determined (block 420.) This may, for example, involve using the method described in connection with FIG. 3 at the initial frequency. After the impedance is determined for the initial frequency, it is determined whether there are additional frequencies for which the speaker impedance should be calculated (block 430.) If impedances should be determined for additional frequencies, then a new frequency is selected (block 440.) The impedance for the new frequency is determined (block 420) and the process is repeated for as many additional frequencies as desired. It should be noted that the reference voltage need not be changed for the different test signal frequencies.

When there are no additional frequencies for which the impedance of the speaker needs to be determined (see block 430,) the impedance-versus-frequency data points are combined to form an impedance profile for the speaker (block 450.) The impedance profile is then used to modify the frequency response of the speaker, if necessary, to optimize the response of the amplifier for the speaker (block 460.)

It should be noted that the manner in which the frequency response of the amplifier is modified may vary from one embodiment to another. For example, the amplifier may implement filters (e.g., a band of parametric equalizers) or other mechanisms to change the frequency response. In one embodiment, the amplifier may initially be optimized for a first speaker, and may therefore have a frequency response that complements the impedance profile of the first speaker. If the impedance profile of the speaker that is actually connected to the amplifier is different from that of the first speaker, the amplifier can change the filtering of the audio signal to compensate for the differences between the first and actual impedance profiles.

In another embodiment, an amplifier may store a collection (a library) of impedance profiles for known speakers. These impedance profiles may be generated using any suitable methods, such as those described above. The impedance profiles may alternatively be derived from data sheets or other sources of information for the speakers. In addition to the impedance profiles, the amplifier stores operating parameters (e.g., frequency response data) for the speakers. For each impedance profile, there are one or more corresponding operating parameters that are stored. In this embodiment, when an impedance profile is generated for a speaker that is connected to the amplifier, the amplifier compares the generated impedance profile to the impedance profiles that are stored in the library. If the profile of the actual speaker matches one of the library profiles, the operating parameters corresponding to the matching library profile are selected and implemented in the amplifier in order to optimize the performance of the amplifier.

It should be noted that the operating parameters discussed in the preceding paragraph may include a variety of different things that affect the performance of the system, such as frequency response compensation, signal timing alignment, crossover parameters, and so on. These operating parameters affect the specific manner in which the amplifier performs with respect to particular system characteristics. These may include any number of characteristics that a system designer might wish to "fine tune" in the amplifier, but which cannot be optimized without knowing the specific characteristics of the speaker(s) that are connected to the amplifier. This feature allows the designer to fine tune the amplifier's performance for a variety of different speakers and, when the amplifier determines which speaker is actually connected to the amplifier, the corresponding operating parameters can be implemented in order to optimize the performance of the system.

In another embodiment, an amplifier includes means to accumulate and process the results of multiple tests in order to improve the accuracy of the speaker current measurement. For example, the accumulation/processing means may consist of an integrator that is configured to process the binary over-threshold signal and to provide a resulting signal to a variable gain block. This is illustrated in FIG. 5.

Figure 5:
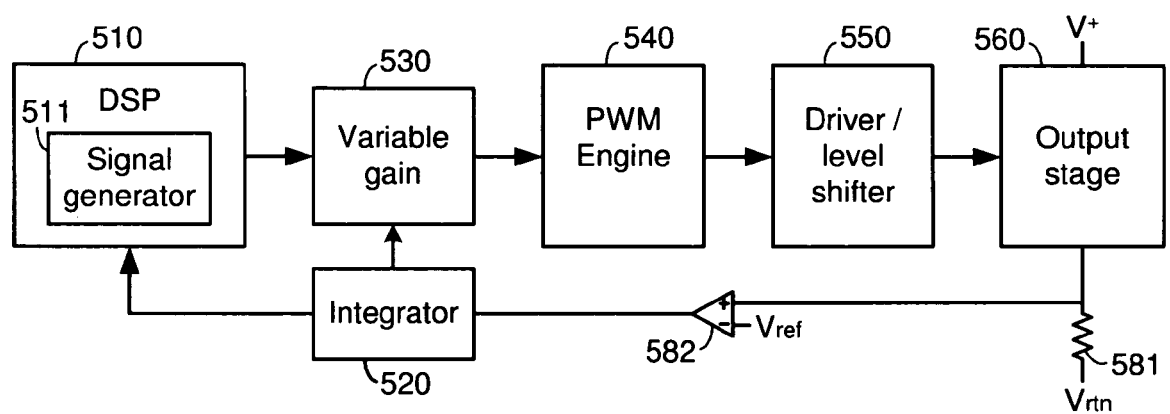
FIG. 5 is a functional block diagram illustrating a digital POM amplifier in accordance with one alternative embodiment.

Referring to FIG. 5, a functional block diagram illustrating a digital POM amplifier in accordance with one alternative embodiment is shown. In this figure, a DIP 510 includes a test signal generator 511 which is configured to generate pulse code modulated (POM) test signals. Rather than being provided directly to POM engine 540, the POM signal is provided to a variable gain block 530. Variable gain block 530 adjusts the gain of the POM signal according to a control signal received from integrator 520. the gain-adjusted POM signal is then provided to POM engine 540, which converts the stream of POM audio data into POM audio data. The POM data is provided to driver/level shifter 550, which produces a pair of signals to drive output stage/speaker 560.

As in the embodiment of FIG. 2, a sense resistor 581 is placed in series with the speaker, and the voltage across resistor 581 is provided to a differential amplifier 582. Differential amplifier 582 then generates the over-threshold signal that indicates whether the voltage across resistor 581 is higher or lower than a reference voltage which is also provided to the differential amplifier. The over-threshold signal produced by differential amplifier 582 is provided to integrator 520 which, as noted above, processes the binary over-threshold signal and provides the resulting control signal to variable gain block 530.

This embodiment forms a closed loop system that regulates the output signal level as a function of the output impedance. The lower the impedance, the lower the output signal level. With a continuous test signal, the control voltage becomes representative of the output impedance. The control loop provides real-time averaging over thousands of measurements, which greatly increases the accuracy and repeatability of the current (or impedance) measurement. This control loop also has the advantage of requiring minimal maintenance on the part of the DIP.

In one embodiment, the same closed-loop mechanism described above can be used to enhance impedance detection during a test mode and to provide circuit protection in an operational mode. In the test mode, a very low reference voltage is used in the comparison with the voltage across the sense resistor. This is sufficient to provide the necessary information to determine the impedance of the output load. When the system exits the test mode and enters the operational mode, the reference voltage is increased to a level that is equal to the resistance of the sense resistor times an upper current threshold. This threshold may, for example, be a maximum allowable current. In this case, the differential amplifier (or other comparator) compares the sense resistor voltage to the reference voltage and generates an output signal that indicates whether the load current has exceeded the maximum threshold. If so, then the amplifier may be configured to take such action as shutting down or limiting the current in order to avoid damage to the system.

Another alternative embodiment is designed to reduce the impact of errors that arise from variability in the amplifier. The accuracy of current/impedance measurements is affected by the tolerances and inaccuracies of various components in the system. For instance, there may be variations in the output power supply voltage, in the reference voltage level, and in the resistance of the sense resistor. This alternative embodiment provides a mechanism to effectively cancel these errors out of the system's measurements.

Figure 6:
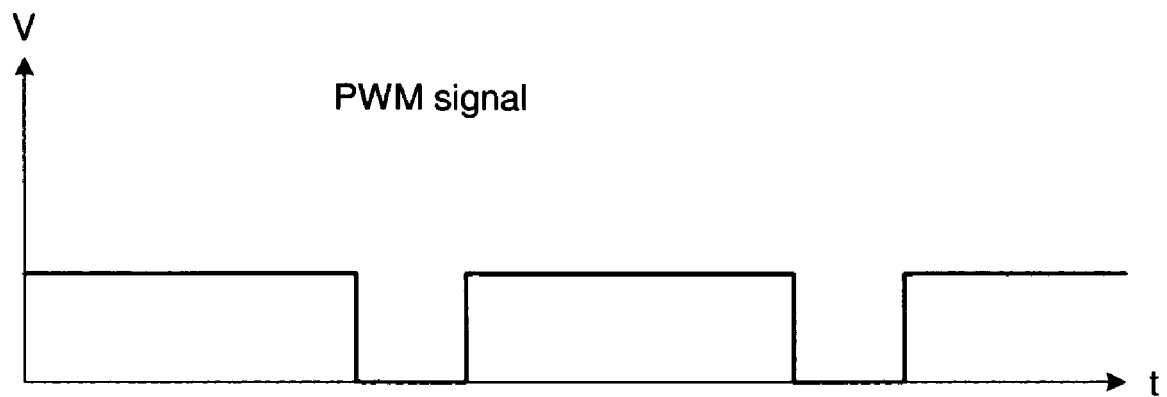
FIG. 6 is a diagram illustrating the linear increase/decrease of current through the sense resistor as a function of time in accordance with one embodiment.
Figure 6:
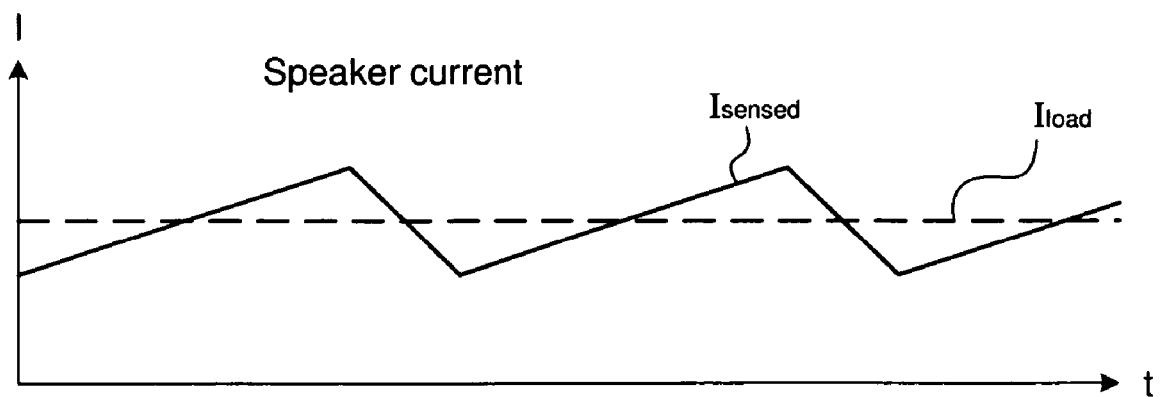

This embodiment makes use of several ideas to reduce the effects of variability in the system. One of the ideas makes use of the fact that the current through the sense resistor is trapezoidal. ("Trapezoidal" as used here refers to the fact that the speaker current passes through an inductive element that causes the current to increase or decrease linearly, as shown in FIG. 6.) The current therefore has a low frequency audio component and a high frequency ripple component due to the CL filter in the output. This at first appears to be problematic because, at very low levels of audio, the magnitude of the ripple voltage is much greater than the audio contribution. The amplifier, however, employs a debounce mechanism that causes the over-threshold signal to be passed to the DIP only if the signal is asserted by the comparator for a minimum interval (a selected amount of time or number of cycles.) As a result, the signal does not "bounce" between asserted and deasserted states. By carefully adjusting the debounce counters that process the over-threshold signal, audio components of the signal can be discriminated from the ripple voltage even when the reference voltage is set well below the level of the ripple voltage. It should be noted that the same debounce mechanism used for this purpose during testing used for other purposes during normal operation of the amplifier.

Another idea of which this embodiment takes advantage is the use of multiple debounce timing values. In this embodiment, readings are made with the debounce timing set to use two different values. Then, rather than processing the actual readings, the measurement ratio is used. As a result, many of the variables which cannot be controlled, including several of the largest error contributors, cancel out in the mathematical equations that are applied. The calculations become insensitive to power supply, the absolute value of the reference voltage and the sense resistor value. The equations are instead a function of output filter components and debounce timing, both of which can be accurately controlled.

Only a few of the possible embodiments of the invention have been discussed in this disclosure. Many alternative embodiments are possible, and many will be apparent to persons of skill in the art of the invention upon reading this disclosure. It should also be noted that the various components of the systems described above should be construed broadly to include comparable components. For instance, while the foregoing description refers to speakers, this should be construed to include other types of output loads (e.g., subsequent amplifiers) as well. Similarly, references to the DIP should be construed to include other types of processors and/or control circuitry, references to the differential amplifier should be construed to include other types of comparators, and so on.

Those of skill in the art will understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. The information and signals may be communicated between components of the disclosed systems using any suitable transport media, including wires, metallic traces, vias, optical fibers, and the like.

Those of skill will further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Those of skill in the art may implement the described functionality in varying ways for each particular application, but such implementation decisions should not be interpreted as causing a departure from the scope of the present invention.

The various illustrative logical blocks, modules, and circuits described in connection with the embodiments disclosed herein may be implemented or performed with general purpose processors, digital signal processors (DSPs) or other logic devices, application specific integrated circuits (ASICs), field programmable gate arrays (FPGAs), discrete gates or transistor logic, discrete hardware components, or any combination thereof designed to perform the functions described herein. A general purpose processor may be any conventional processor, controller, microcontroller, state machine or the like. A processor may also be implemented as a combination of computing devices, e.g., a combination of a DIP and a microprocessor, a plurality of microprocessors, one or more microprocessors in conjunction with a DIP core, or any other such configuration.

The steps of the methods or algorithms described in connection with the embodiments disclosed herein may be embodied directly in hardware, in software or firmware modules executed by a processor, or in a combination thereof. A software product may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

The benefits and advantages which may be provided by the present invention have been described above with regard to specific embodiments. These benefits and advantages, and any elements or limitations that may cause them to occur or to become more pronounced are not to be construed as critical, required, or essential features of any or all of the claims. As used herein, the terms "comprises," "comprising," or any other variations thereof, are intended to be interpreted as non-exclusively including the elements or limitations which follow those terms. Accordingly, a system, method, or other embodiment that comprises a set of elements is not limited to only those elements, and may include other elements not expressly listed or inherent to the claimed embodiment.

While the present invention has been described with reference to particular embodiments, it should be understood that the embodiments are illustrative and that the scope of the invention is not limited to these embodiments. Many variations, modifications, additions and improvements to the embodiments described above are possible. It is contemplated that these variations, modifications, additions and improvements fall within the scope of the invention as detailed within the following claims.

What is claimed is:

1. A method implemented in a digital amplifier comprising:
    (a) generating a digital test signal;
    (b) converting the digital test signal to an analog signal;
    (c) driving a load with the analog signal;
    (d) detecting a threshold level of current through the load;
    (e) identifying a value of the digital test signal that generated the threshold level of current through the load; and
    (f) calculating an impedance of the load based on the threshold level of current through the load and the corresponding value of the digital test signal.

2. The method of claim 1, wherein detecting a threshold level of current through the load comprises comparing a measured analog signal corresponding to the level of current through the load to an analog reference signal corresponding to the threshold level of current and generating a binary signal that indicates whether the measured analog signal exceeds the analog reference signal.

3. The method of claim 1, further comprising repeating (a)-(f) with multiple digital test signals having different frequencies and one or more threshold levels of current through the load, and calculating an impedance profile of the load based on the threshold levels of current through the load and the corresponding values of the digital test signals.

4. The method of claim 3, further comprising comparing the calculated impedance profile of the load to a library of impedance profiles and selecting one of the impedance profiles in the library that matches the calculated impedance profile of the load.

5. The method of claim 4, further comprising implementing a set of operating parameters in the digital amplifier that is associated with the selected one of the impedance profiles in the library.

6. The method of claim 1, wherein the digital test signal comprises a pulse code modulated (PCM) signal and converting the digital test signal to the analog signal comprises converting the PCM signal to a pulse width modulated (PWM) signal and converting the PWM signal to the analog signal.

7. The method of claim 6, wherein detecting the threshold level of current through the load comprises comparing a voltage across a sense resistor that is in series with the load to a reference voltage that is equal to a resistance of the sense resistor times the threshold level of current.

8. The method of claim 7, further comprising asserting a binary signal when the voltage across the sense resistor exceeds the reference voltage.

9. The method of claim 7, further comprising asserting an interrupt when the voltage across the sense resistor exceeds the reference voltage.

10. A method comprising:
in a test mode,
generating a digital test signal,
converting the digital test signal to an analog test signal,
applying the analog test signal across a load and a sense resistor,
comparing a voltage across the sense resistor to a first reference voltage, wherein the first reference voltage is equal to a resistance of the sense resistor times a first threshold level of current,
generating a binary signal indicating whether the voltage across the sense resistor exceeds the first reference voltage,
identifying a value of the digital test signal that causes the binary signal to transition between high and low states, and
calculating an impedance of the load based on the first threshold level of current and the identified value of the digital test signal;
in an operational mode,
converting a digital audio digital test signal to an analog audio signal,
applying the analog signal across a load and a sense resistor,
comparing a voltage across the sense resistor to a second reference voltage, wherein the second reference voltage is equal to a resistance of the sense resistor times a second threshold level of current which is higher than the first threshold level of current,
generating a binary signal indicating whether the voltage across the sense resistor exceeds the second reference voltage, and
taking a protective action to limit the load current when the binary signal indicates that the voltage across the sense resistor exceeds the second reference voltage.

11. The method of claim 10, wherein the protective action comprises at least temporarily shutting down the amplifier.

12. A digital amplifier comprising:
a digital test signal generator configured to generate a digital test signal;
an engine configured to convert the digital test signal to an analog signal;
an output stage configured to receive the analog signal and to drive a load and a sense resistor in series with the load with the analog signal;
a reference voltage generator configured to generate a reference voltage equal to a resistance of the sense resistor times a threshold level of current;
a comparator configured to compare a voltage across the sense resistor to the reference voltage and to generate a binary signal indicating whether the voltage across the sense resistor exceeds the reference voltage;
a processor configured to identify a value of the digital test signal corresponding to a transition in the binary signal and to calculate an impedance of the load based on the threshold level of current and the value of the digital test signal corresponding to the transition in the binary signal.

13. The digital amplifier of claim 12, wherein the voltage across the sense resistor and the reference voltage comprise analog signals.

14. The digital amplifier of claim 12, wherein the digital test signal generator is configured to generate digital test signals of different frequencies for multiple tests; and wherein the processor is configured to identify values of each digital test signal corresponding to transitions in the binary signal and to calculate impedances of the load for each test signal frequency based on the threshold level of current and the value of each digital test signal corresponding to transitions in the binary signal.

15. The digital amplifier of claim 14, wherein the processor is configured to compare the calculated impedances for each test signal frequency to a library of impedance profiles and to select one of the impedance profiles in the library that matches the calculated impedances of the load.

16. The digital amplifier of claim 15, wherein the processor is further configured to implement a set of operating parameters in the digital amplifier that is associated with the selected one of the impedance profiles in the library.

17. The digital amplifier of claim 12, wherein the digital test signal generator is configured to generate a pulse code modulated (PCM) signal and the engine configured to convert the digital test signal to an analog signal comprises a pulse width modulated (PWM) engine.

18. The digital amplifier of claim 12, wherein the processor is configured to assert an interrupt when the binary signal transitions from low to high.

19. The digital amplifier of claim 18, further comprising an accumulator configured to receive the binary signal and to assert an output signal to the processor only if the binary signal is asserted for a predetermined interval.

20. The digital amplifier of claim 12, wherein:
in a test mode,
the reference voltage generator is configured to generate a first reference voltage equal to a resistance of the sense resistor times a first threshold level of current below a maximum current level, and the processor is configured to calculate the impedance of the load based on the threshold level of current and the value of the digital test signal corresponding to the transition in the binary signal; and in an operational mode, the reference voltage generator is configured to generate a second reference voltage equal to a resistance of the sense resistor times a second threshold level of current which is higher than the first threshold level of current; and the processor is configured to take action to limit the current through the load when the binary signal is asserted.

* * * * *

UNITED STATES PATENT AND TRADEMARK OFFICE
CERTIFICATE OF CORRECTION

PATENT NO. : 7,259,618 B2
APPLICATION NO. : 11/211765
DATED : August 21, 2007
INVENTOR(S) : Hand et al.

It is certified that error appears in the above-identified patent and that said Letters Patent is hereby corrected as shown below:

At Column 1, line 43, replace "POM" with --PWM--;

At Column 1, line 44, replace "POM" with --PWM--;

At Column 1, line 46, replace "SUMPS" with --SMPS--;

At Column 1, line 55, replace "SUMPS" with --SMPS--;

At Column 1, line 63, replace "POM" with --PWM--;

At Column 1, line 65, replace "POM" with --PWM--;

At Column 1, line 66, replace "POM" with --PWM--;

At Column 2, line 1, replace "POM" with --PWM--;

At Column 2, line 39, replace "POM" with --PWM--;

At Column 4, line 7, replace "POM" with --PWM--;

At Column 4, line 47, replace "POM" with --PWM--;

At Column 5, line 20, replace "POM" with --PWM--;

At Column 5, line 22, replace "POM" with --PWM--;

At Column 5, line 23, replace "POM-to-POM" with --PCM-to-PWM--;

At Column 5, line 26, replace "POM-to-POM" with --PCM-to-PWM--;

At Column 5, line 43, replace "POM" with --PWM--;

At Column 6, line 13, replace "POM" with --PWM--;

At Column 6, line 16, replace "(DIP) 210. DIP" with --(DSP) 210. DSP--;

At Column 6, line 18, replace "(POM) test signals that are provided to POM" with --(PCM) test signals that are provided to PWM--;

At Column 6, line 19, replace "POM engine 240 converts the stream of POM" with --PWM engine 240 converts the stream of PCM--;

At Column 6, line 20, replace "DIP 210 into POM" with --DSP 210 into PWM--;

At Column 6, line 21, replace "POM" with --PWM--;

At Column 6, line 32, replace "DIP" with --DSP--;

At Column 6, line 37, replace "POM data. The POM" with --PCM data. The PCM--;

At Column 6, line 38, replace "POM engine 240 into a POM" with --PWM engine 240 into a PWM--;

At Column 7, line 11, replace "DIP" with --DSP--;

At Column 7, line 13, replace "DIP" with --DSP--;

At Column 7, line 19, replace "POM" with --PCM--;

At Column 7, line 29, replace "POM" with --PCM--;

At Column 7, line 34, replace "POM" with --PCM--;

At Column 7, line 38, replace "POM test signal is processed by the POM" with --PCM test signal is processed by the PWM--;

At Column 7, line 41, replace "POM signal to a POM" with --PCM signal to a PWM--;

At Column 7, line 42, replace "POM" with --PWM--;

At Column 7, line 43, replace "POM" with --PWM--;

At Column 7, line 60, replace "POM" with --PWM--;

At Column 8, line 1, replace "DIP" with --DSP--;

At Column 8, line 2, replace "DIP" with --DSP--;

At Column 8, line 3, replace "POM" with --PCM--;

At Column 8, line 6, replace "POM" with --PCM--;

At Column 8, line 8, replace "POM" with --PCM--;

CERTIFICATE OF CORRECTION (continued)
U.S. Pat. No. 7,259,618 B2

At Column 9, line 37, replace "POM" with --PWM--;

At Column 9, line 38, replace "DIP" with --DSP--;

At Column 9, line 40, replace "POM" with --PCM--;

At Column 9, line 41, replace "POM engine 540, the POM" with --PWM engine 540, the PCM--;

At Column 9, line 43, replace "POM" with --PCM--;

At Column 9, line 45, replace "POM signal is then provided to POM" with --PCM signal is then provided to PWM--;

At Column 9, line 46, replace "POM audio data into POM" with --PCM audio data into PWM--;

At Column 9, line 47, replace "POM" with --PWM--;

At Column 10, line 3, replace "DIP" with --DSP--;

At Column 10, line 39, replace "CL" with --LC--;

At Column 10, line 44, replace "DIP" with --DSP--;

At Column 11, line 15, replace "DIP" with --DSP--;

At Column 11, line 59, replace "DIP" with --DSP--;

At Column 11, line 60, replace "DIP" with --DSP--.

Signed and Sealed this

Twenty-sixth Day of January, 2010

David J. Kappos
*Director of the United States Patent and Trademark Office*